(12) United States Patent
Oh

(10) Patent No.: US 8,169,847 B2
(45) Date of Patent: May 1, 2012

(54) SEMICONDUCTOR MEMORY APPARATUS AND REFRESH CONTROL METHOD OF THE SAME

(75) Inventor: Young Hoon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 358 days.

(21) Appl. No.: 12/494,857

(22) Filed: Jun. 30, 2009

(65) Prior Publication Data

US 2010/0260003 A1 Oct. 14, 2010

(30) Foreign Application Priority Data

Apr. 14, 2009 (KR) ................. 10-2009-0032364

(51) Int. Cl.
*G11C 7/00* (2006.01)

(52) U.S. Cl. ............. 365/222; 365/230.06; 365/233.1; 365/236; 365/185.15

(58) Field of Classification Search ............ 365/222, 365/230.06, 236, 233, 185.18, 233.1
See application file for complete search history.

(56) References Cited

U.S. PATENT DOCUMENTS

| | | | |
|---|---|---|---|
| 6,633,500 B1 * | 10/2003 | Chou et al. | 365/185.25 |
| 6,856,568 B1 * | 2/2005 | Wong | 365/222 |
| 7,016,246 B2 * | 3/2006 | Watanabe et al. | 365/222 |
| 7,170,807 B2 | 1/2007 | Fazan et al. | |
| 7,187,581 B2 | 3/2007 | Ferrant et al. | |
| 7,440,329 B2 | 10/2008 | Ohsawa | |
| 7,486,563 B2 | 2/2009 | Waller et al. | |
| 7,492,632 B2 | 2/2009 | Carman | |
| 7,499,358 B2 | 3/2009 | Bauser | |
| 2008/0316848 A1 | 12/2008 | Ohsawa | |

FOREIGN PATENT DOCUMENTS

JP 2008-283158 A 11/2008
* cited by examiner

*Primary Examiner* — Son Dinh
(74) *Attorney, Agent, or Firm* — Ladas & Parry LLP

(57) ABSTRACT

A semiconductor memory apparatus and refresh control method are presented. The semiconductor memory apparatus includes a memory cell block composed of a multiplicity of floating body cell (FBC) transistors. Each FBC transistor has a gate connected to a word line, a drain connected to a bit line, and a source connected to a source line. FBC transistor pairs are formed by sharing the source lines in the plurality of the floating body cell transistors. When a refresh signal is enabled, the semiconductor memory apparatus is configured to read data stored in the memory cell block by enabling a refresh read signal and then configured to rewrite the read data in the memory cell block by enabling a refresh write signal.

44 Claims, 7 Drawing Sheets

SEMICONDUCTOR MEMORY APPARATUS AND REFRESH CONTROL METHOD OF THE SAME

CROSS-REFERENCES TO RELATED PATENT APPLICATION

The present application claims priority under 35 U.S.C 119(a) to Korean Application No. 10-2009-0032364, filed on Apr. 14, 2009, in the Korean Intellectual Property Office, the disclosure of which is incorporated herein by reference in its entirety as set forth in full.

BACKGROUND

1. Technical Field

The present invention relates to a semiconductor memory apparatus and, more particularly, to a memory cell of a semiconductor memory apparatus and a control circuit thereof.

2. Related Art

A conventional dynamic random access memory (DRAM) includes numerous memory cells that are each composed of one transistor and one capacitor to store data. However, a general structure having those memory cells is not suitable to decrease an area of a memory core region, such that there is a technical limitation in improving an integration degree of a semiconductor memory apparatus. Therefore, a floating body cell (FBC) technology for implementing the transistor and the capacitor of the memory cell as one transistor has been developed.

Hereinafter, the FBC technology will be described in more detail with reference to the accompanying drawings.

FIG. 1 is a cross-sectional view of a transistor implementing an FBC and illustrates an N-type transistor as an example. It is understood herein that the drawings are not necessarily to scale and in some instances proportions may have been exaggerated in order to more clearly depict certain features of the invention.

As shown in FIG. 1, like a general N-type MOS transistor, the transistor implementing the FBC has a structure in which a source 1 and a drain 2 doped with N-type impurities are configured on a semiconductor substrate and a gate electrode 3 and a gate oxide layer 4 are formed at a predetermined region of a top part of the source 1 and the drain 2. However, an insulating layer 5 is provided in a center portion of a body region. Therefore, the body region is divided into a floating body part 6 and a substrate part 7. At this time, the floating body part 6 and the substrate part 7 are doped with P-type impurities.

The insulating layer 5 is interposed between the floating body part 6 and the substrate part 7, such that holes are accumulated in the floating body part 6 by voltages respectively applied to the source 1, the drain 2, and the gate electrode 3. Therefore, a virtual capacitor is formed in the FBC. Due to characteristics of the capacitor generated as above, the transistor can be utilized as a memory cell having a structure in which a switching transistor and the memory cell are combined with each other.

In order to implement the FBC technology, a predetermined voltage must be accurately applied to each of the source, the drain, and the gate of the transistor in a read operation or a write operation. Further, in the FBC technology, a support for a hold operation is required as well as the read and write operations and an operation of inputting a logical value of '1', and an operation of inputting a logical value of '0' need to be distinguished even during the write operation.

Likewise, levels of voltages to be applied to the source, the drain, and the gate are shown in Table 1 depending on each operation.

TABLE 1

|  | Write '1' operation | Write '0' operation | Read operation | Hold operation |
| --- | --- | --- | --- | --- |
| Source voltage | 2.5 V | 2.5 V | 2.5 V | 0 V |
| Drain voltage | 0 V | 0.5 V | 0 V | 0 V |
| Gate voltage | 0.5 V | 0.5 V | −1.0 V | −1.5 V |

As seen from Table 1, a cell transistor in the FBC technology should be applied with voltages set at a source, a drain, and a gate thereof at the time of performing four different operations. For this, a circuit for supplying a voltage to each of the source, the drain, and the gate of the cell transistor for each operation should be provided.

Up to now, the FBC technology is difficult to utilize as the memory cell of the semiconductor memory apparatus because circuits for supplying voltages to the source, the drain, and the gate of each cell transistor have not yet been developed. Moreover, data of the semiconductor memory apparatus adopting the FBC technology are also volatile like in the DRAM. Therefore, even herein, a refresh operation should be performed and the relevant technical configuration should be provided. As such, development of relevant circuits is keenly necessary in order to adopt the FBC technology for improving the integration degree of the semiconductor memory apparatus.

SUMMARY

The present invention provides a semiconductor memory apparatus and a refresh control method of the same that can implement an FBC technology in a cell transistor of a memory core region.

In a first embodiment, a semiconductor memory apparatus includes a memory cell block comprising a plurality of floating body cell (FBC) transistors, each FBC transistor having a gate connected to a word line, a drain connected to a bit line, and a source connected to a source line, wherein FBC transistor pairs are formed by sharing the source lines in the FBC transistors, wherein when a refresh signal is enabled, the semiconductor memory apparatus is configured to read data stored in the memory cell block in response to an enabled refresh read signal and then rewrite the read data in the memory cell block in response to an enabled refresh write signal.

In a second embodiment, a semiconductor memory apparatus includes a refresh controller configured to generate a refresh enable signal, a refresh read signal, a refresh write signal, and a refresh sense amp enable signal in response to a refresh signal; a row operation controller configured to supply voltages to a word line and a source line of a memory cell block in response to the refresh read signal and the refresh write signal when the refresh enable signal is enabled; a column operation controller configured to amplify data transferred from a bit line of the memory cell block in response to the refresh read signal, the refresh sense amp enable signal, and the refresh write signal when the refresh enable signal is enabled and configured to supply a voltage corresponding to the amplified data to the bit line; and a data bus switch configured to interrupt outputting of the amplified data to a data input/output bus when the refresh enable signal is enabled.

In a third embodiment, a semiconductor memory apparatus includes a row refresh counter configured to generate a row counting signal and a source counting signal by performing a counting operation when a refresh enable signal is enabled; a row address decoder configured to generate a row selection signal by decoding the row counting signal; a source address decoder configured to generate a source selection signal by decoding the source counting signal; a row operation controller configured to sequentially supply voltages to a plurality of word lines and a plurality of source lines of a memory cell block in response to the row selection signal and the source selection signal when the refresh enable signal is enabled; a column refresh counter configured to generate a column counting signal by performing the counting operation when the refresh enable signal is enabled; a column address decoder configured to generate a column selection signal by decoding the column counting signal; and a column operation controller configured to sequentially rewrite data of a plurality of bit lines of the memory cell block in response to the column selection signal when the refresh enable signal is enabled.

In a fourth embodiment, a refresh control method of a semiconductor memory apparatus including a memory cell block having a plurality of floating body cell (FBC) transistors having a gate connected to a word line, a drain connected to a bit line, and a source connected to a source line, wherein FBC transistor pairs are formed by sharing the source lines in the FBC transistors, the refresh control method includes enabling a refresh read signal when a refresh signal is enabled; outputting data from any one memory cell by supplying voltages to the word line, the source line, and the bit line in response to the refresh read signal; disabling the refresh read signal and enabling a refresh write signal; and rewriting the data in the bit line by supplying a voltage having a level corresponding to a logical value of data output from the memory cell in response to the refresh write signal.

In a fifth embodiment, a refresh control method of a semiconductor memory apparatus including a memory cell block composed of a plurality of floating body cell (FBC) transistors, each FBC transistor having a gate connected to a word line, a drain connected to a bit line, and a source connected to a source line, wherein FBC transistor pairs are formed by sharing the source lines in the plurality of the floating body cell transistors, the refresh control method includes supplying voltages for a read operation or a write operation to a first word line and a first source line when a refresh enable signal is enabled; sequentially performing a rewriting operation of data in the plurality of bit lines; deactivating the first word line and supplying a voltage for the read or write operation to a second word line; sequentially re-performing the rewriting operation of data for the plurality of bit lines; and deactivating the second word line and the first source line and activating a third word line and a second source line.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
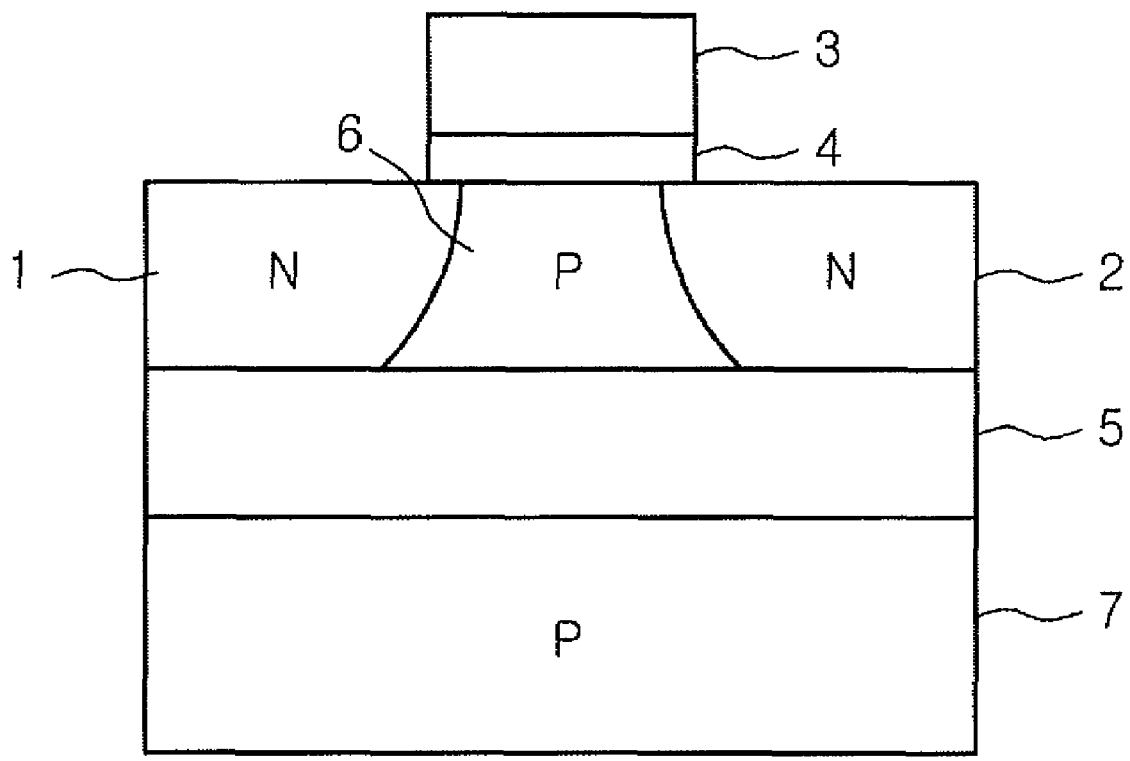
FIG. 1 is a cross-sectional view of a transistor implementing an FBC.
Figure 2:
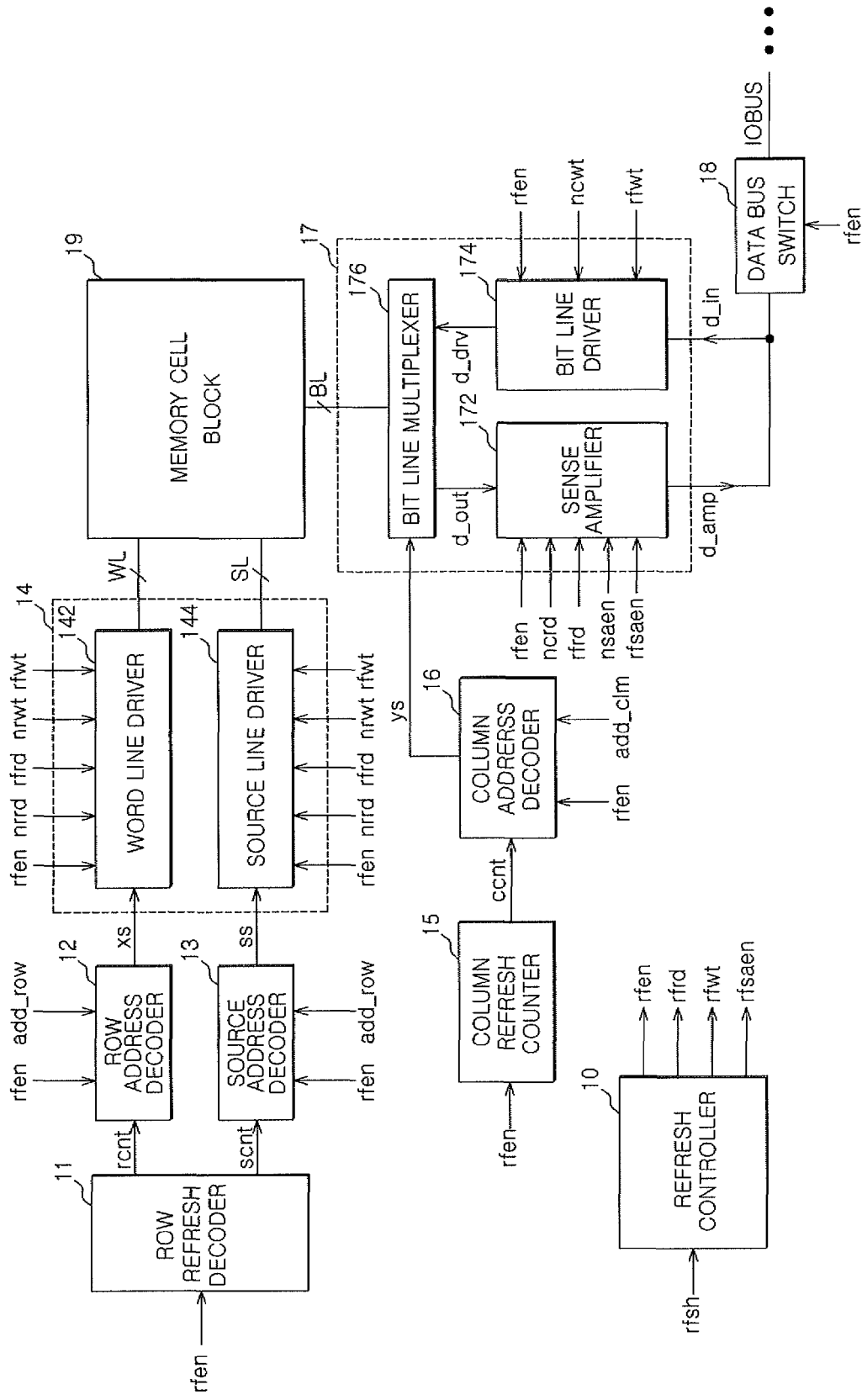
FIG. 2 is a block diagram illustrating a configuration of a memory core region of a semiconductor memory apparatus according to one embodiment.

FIG. 2 is a block diagram illustrating a configuration of a memory core region of a semiconductor memory apparatus according to one embodiment.

As shown in FIG. 2, the semiconductor memory apparatus can include a refresh controller 10, a row refresh counter 11, a row address decoder 12, a source address decoder 13, a row operation controller 14, a column refresh counter 15, a column address decoder 16, a column operation controller 17, a data bus switch 18, and a memory cell block 19.

The refresh controller 10 can generate a refresh enable signal 'rfen', a refresh read signal 'rfrd', a refresh write signal 'rfwt' and a refresh sense amp enable signal 'rfsaen' in response to a refresh signal 'rfsh'. The row refresh counter 11 can generate a plural-bit row counting signal 'rcnt' and a plural-bit source counting signal 'scnt' by performing a counting operation in response to the refresh enable signal 'rfen'. The row address decoder 12 can generate a plural-bit row selection signal 'xs' by decoding the row counting signal 'rcnt' in response to the refresh enable signal 'rfen'. The source address decoder 13 can generate a plural-bit source selection signal 'ss' by decoding the source counting signal 'scnt' in response to the refresh enable signal 'rfen'. The row operation controller 14 can supply voltages to a plurality of word lines 'WL' and a plurality of source lines 'SL' in response to the refresh enable signal 'rfen', a normal row read signal 'nrrd', the refresh read signal 'rfrd', a normal row write signal 'nrwt' the refresh write signal 'rfwt' the plural-bit row selection signal 'xs' and the plural-bit source selection signal 'ss'.

The column refresh counter 15 can generate a plural-bit column counting signal 'ccnt' by performing the counting operation in response to the refresh enable signal 'rfen'. The column address decoder 16 can generate a plural-bit column selection signal 'ys' by decoding the plural-bit column counting signal 'ccnt' in response to the refresh enable signal 'rfen'. The column operation controller 17 can amplify and output data transmitted from any one of a plurality of bit lines 'BL' as amplification data 'd_amp' or drive and transfer input data 'd_in' to any one of the plurality of bit lines 'BL' in response to the refresh enable signal 'rfen' a normal column read signal 'ncrd' the refresh read signal 'rfrd', a normal column write signal 'ncwt', the refresh write signal 'rfwt', a normal sense amp enable signal 'nsaen', the refresh sense amp enable signal 'rfsaen', and the plural-bit column selection signal 'ys'. The data bus switch 18 can interrupt outputting the amplification data 'd_amp' to a data input/output bus IOBUS and inputting data transferred from the data input/output bus IOBUS into the column operation controller 17 in response to the refresh enable signal 'rfen'. The memory cell block 19 are connected to the plurality of word lines 'WL', the plurality of source lines 'SL', and the plurality of bit lines 'BL'. The memory cell block 19 includes a plurality of memory cells.

The refresh controller 10 can generate the refresh enable signal 'rfen', the refresh read signal 'rfrd', the refresh write signal 'rfwt', and the refresh sense amp enable signal 'rfsaen' in response to the refresh signal 'rfsh', as described above. Waveforms of the signals are shown in FIG. 3.

Figure 3:
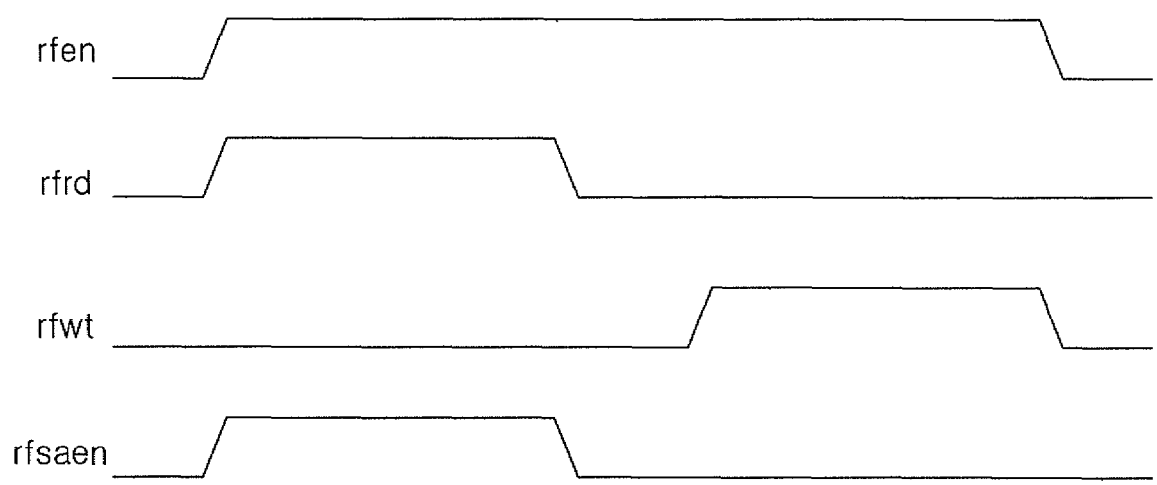
FIG. 3 is a waveform diagram for illustrating an operation of a refresh controller of FIG. 2.

FIG. 3 is a waveform diagram for illustrating an operation of a refresh controller of FIG. 2.

Referring to FIG. 3, the refresh enable signal 'rfen' has a predetermined enable interval. In this interval, after the refresh read signal 'rfrd' is enabled and then disabled, the refresh write signal 'rfwt' is enabled and then disabled. The refresh sense amp enable signal 'rfsaen' has a wave form similar to the refresh read signal 'rfrd'.

This waveform is illustrated for only a refresh operation with respect to one memory cell that is included in the memory cell block 19. The operation is repeated at as many times as memory cells during the refresh operation is performed. A configuration of the refresh controller 10 that generates the signals having the waveform can be easily implemented by those skilled in the art. Therefore, a detailed configuration of the refresh controller 10 will be omitted.

The memory cell block 19 includes a plurality of memory cells implemented by an FBC transistor. The word lines 'WL' are provided as many as the rows of the plurality of memory cells, the source lines 'SL' are provided a half as many as the word lines 'WL', and the bit lines 'BL' are provided as many as the columns of the plurality of memory cells.

As a result, in order to perform the refresh operation for each memory cell, the row refresh counter 11 performs a counting operation in respects to the plural-bit row counting signal 'rcnt' two times faster than a counting operation in respects to the plural-bit source counting signal 'scnt'. Further, the column refresh counter 15 performs a counting operation in respects to the plural-bit column counting signal 'ccnt' times as many as all the bit lines 'BL' faster than the counting operation of the row refresh counter 11 in respects to the plural-bit row counting signal 'rcnt'. Accordingly, a logical value of the plural-bit column selection signal 'ys' generated from the column address decoder 16 varies times as may as all the bit lines 'BL' faster than and a logical value of the plural-bit source selection signal 'ss' varies two times slower than the plural-bit row selection signal 'xs' generated from the row address decoder 12.

That is, the semiconductor memory apparatus sequentially performs the refresh operation in respects to the plurality bit lines 'BL' in a state where a predetermined word line 'WL' and a predetermined source line 'SL' are activated. Thereafter, the semiconductor memory apparatus deactivates the word line 'WL' and activates the other word line 'WL' and then repeats the above-mentioned operation. The predetermined source line 'SL' is activated while two word lines 'WL' are sequentially activated. Thereafter, when the other word line 'WL' is activated, the other source line 'SL' is activated. The semiconductor memory apparatus repetitively performs the operation so as to perform the refresh operation in respects to each of a plurality of memory cells included in the memory cell block 19.

The row address decoder 12 and the source address decoder 13 receive a plural-bit row address 'add_row' in the case when the refresh enable signal 'rfen' is not enabled, that is, in a normal mode and performs a decoding operation in respects to the plural-bit row address 'add_row'. Further, the column address decoder 16 receives a plural-bit column address 'add_clm' in the normal mode and performs a decoding operation in respects to the plural-bit column address 'add_clm'. On the contrary, when the refresh enable signal 'rfen' is enabled, the row address decoder 12 and the source address decoder 13 performs the decoding operation in response to the plural-bit row counting signal 'rcnt' and the column address decoder 16 performs the decoding operation in response to the plural-bit column counting signal 'ccnt'.

The row operation controller 14 can supply voltages to the plurality of word lines 'WL' and the plurality of source lines 'SL' of the memory cell block 19 in response to the normal row read signal 'nrrd' the normal row write signal 'nrwt', the plural-bit row selection signal 'xs', and the plural-bit source selection signal 'ss' in the normal mode. However, when the refresh enable signal 'rfen' is enabled, the row operation controller 14 can supply voltages to the plurality of word lines 'WL' and the plurality of source lines 'SL' of the memory cell block 19 in response to the refresh read signal 'rfrd', the refresh write signal 'rfwt', the plural-bit row selection signal 'xs', and the plural-bit source selection signal 'ss'. At this time, the row operation controller 14 can sequentially supply predetermined voltages to the plurality of word lines 'WL' and the plurality of source lines 'SL' depending on variations of the logical values of the plural-bit row selection signal 'xs' and the plural-bit source selection signal 'ss'.

Herein, the normal row read signal 'nrrd' and the normal row write signal 'nrwt' are generated when a row command decoder (not shown) decodes row commands transferred from the outside. Likewise, the normal column read signal 'ncrd', the normal column write signal 'ncwt', and the normal sense amp enable signal 'nsaen' are generated when a column command decoder (not shown) decodes column commands transferred from the outside.

The row operation controller 14 can include a word line driver 142 and a source line driver 144.

The word line driver 142 can supply voltages to the plurality of word lines 'WL', respectively, in response to the refresh enable signal 'rfen', the normal row read signal 'nrrd', the refresh read signal 'rfrd', the normal row write signal 'nrwt', the refresh write signal 'rfwt', and the plural-bit row selection signal 'xs'. The source line driver 144 can supply voltages to the plurality of source lines 'SL', respectively, in response to the refresh enable signal 'rfen', the normal row read signal 'nrrd', the refresh read signal 'rfrd', the normal row write signal 'nrwt', the refresh write signal 'rfwt', and the plural-bit source selection signal 'ss'.

The column operation controller 17 can amplify and output data of any one of the plurality of bit lines 'BL' or drive and transfer the input data 'd_in' transferred through the data bus switch 18 from the data input/output bus IOBUS to any one of the plurality of bit lines 'BL' in response to the normal column read signal 'ncrd', the normal column write signal 'ncwt', the normal sense amp enable signal 'rfsaen', and the plural-bit column selection signal 'ys' in the normal mode. However, when the refresh enable signal 'rfen' is enabled, the column operation controller 17 amplifies data transferred from any one of the plurality of bit lines 'BL' in response to the refresh read signal 'rfrd' and the refresh sense amp enable signal 'rfsaen' and outputs the data as the amplification data 'd_amp' and thereafter, rewrites the amplification data 'd_amp' in the bit line 'BL' that outputs the data in response to the refresh write signal 'rfwt', in response to the plural-bit column selection signal 'ys'. Herein, the amplification data 'd_amp' is rewritten by supplying a voltage at a predetermined level to the corresponding bit line 'BL'. The plural-bit column selection signal 'ys' controls data to be sequentially output and rewritten from/to the plurality of bit lines 'BL'.

Like this, in order to support the operation of rewriting the data output from the bit lines 'BL' during the refresh operation, the data bus switch 18 is turned off to interrupt connection between the column operation controller 17 and the data input/output bus IOBUS. However, the data bus switch 18 is turned on during the normal operation to connect the data input/output bus IOBUS with the column operation controller 17.

The column operation controller 17 can include a sense amplifier 172, a bit line driver 174, and a bit line multiplexer 176.

The sense amplifier 172 can output the amplification data 'd_amp' by amplifying output data 'd_out' in response to the refresh enable signal 'rfen', the normal column read signal 'ncrd', the refresh read signal 'rfrd', the normal sense amp enable signal 'nasen', and the refresh sense amp enable signal 'saen'. The bit line driver 174 can output driving data 'd_drv' by driving the input data 'd_in' in response to the refresh enable signal 'rfen', the normal column write signal 'ncwt', and the refresh write signal 'rfwt'. The bit line multiplexer 176 can transfer the driving data 'd_drv' to any one of the plurality of bit lines 'BL' or transfer data transferred by any one of the plurality of bit lines 'BL' to the sense amplifier 172 as the output data 'd_out'.

The word line driver 142 can supply any one of a write gate voltage, a read gate voltage, and a hold gate voltage to an activated word line 'WL' depending on each of a read operation mode, a write operation mode, and a hold operation mode that are divided in response to the normal row read signal 'nrrd' and the normal row write signal 'nrwt' during the normal operation. On the contrary, the word line driver 142 can supply the voltages to the activated word line 'WL' in response to the refresh read signal 'rfrd' and the refresh write signal 'rfwt' that are sequentially enabled during the refresh operation. At this time, the word line driver 42 can supply a read gate voltage of −1.0V when the refresh read signal 'rfrd' is enabled and a write gate voltage of 0.5V when the refresh write signal 'rfwt' is enabled, and a hold gate voltage of −1.5V in other cases in consideration of characteristics of the FBC transistor.

Further, the source line driver 144 can supply an active source voltage or a hold source voltage to an activated source line 'SL' depending on each of a hold operation mode and an active operation mode (the active operation mode includes the read operation mode and the write operation mode.) that are divided in response to the normal row read signal 'nrrd' and the normal row write signal 'nrwt' during the normal operation. On the contrary, the source line driver 144 can supply the voltages to the activated source line 'SL' in response to the refresh read signal 'rfrd' and the refresh write signal 'rfwt' that are sequentially enabled during the refresh operation. At this time, the source line driver 144 can supply an active source voltage of 2.5V when the refresh read signal 'rfrd' and the refresh write signal 'rfwt' are enabled and a hold source voltage of 0V in other cases in consideration of the characteristics of the FBC transistor.

The bit line driver 174 distinguishes whether or not to enter the write operation mode in response to the normal column write signal 'ncwt' during the normal operation and supplies a write drain voltage to an output line of the driving data 'd_drv' after determining whether the logical value of the input data 'd_in' is '0' or '1' during the write operation. On the contrary, the bit line driver 174 supplies a voltage to a bit line 'BL' connected through the bit line multiplexer 176 in response to the refresh write signal 'rfwt' during the refresh operation. In this case, the amplification data 'd_amp' generated when the refresh read signal 'rfrd' is enabled is input as the input data 'd_in'. At this time, the write drain voltage of 0V or 0.5V is supplied to the connected bit line 'BL' depending on the logical value of the input data 'd_in' in consideration of the characteristics of the FBC transistor.

The names of the gate voltage, the source voltage, and the drain voltage are granted because the word line 'WL' is connected to a gate of the cell transistor in the memory cell block 19, the source line 'SL' is connected to a source of the cell transistor, and the bit line 'BL' is connected to a drain of the cell transistor. Voltage generators for varying voltage levels of the gate voltage, the source voltage, and the drain voltage can be implemented by using various voltage generators that are provided in the semiconductor memory apparatus depending on the operation modes. It will be apparent that it is not technologically particular to those skilled in the art.

Figure 4:
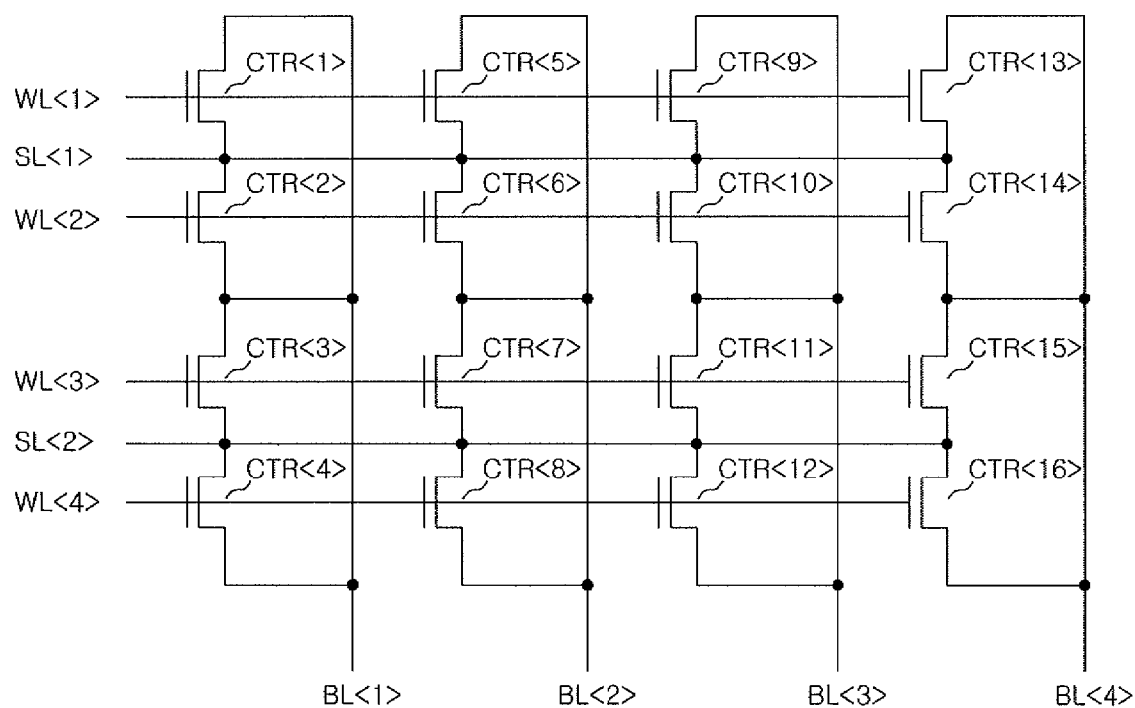
FIG. 4 is a configuration diagram of an exemplary memory cell block of FIG. 2 according to one embodiment.

FIG. 4 is a configuration diagram of an exemplary memory cell block of FIG. 2 according to one embodiment and illustrates only an arrangement relationship of 16 cell transistors for convenience of description.

As shown in FIG. 4, the memory cell block 19 can include four word lines 'WL<1:4>' four bit lines 'BL<1:4>', two source lines 'SL<1:2>', and sixteen cell transistors 'CTR<1:16>'.

Each of the two source lines 'SL<1:2>' is disposed between two word lines 'WL<1:2>' and two word lines 'WL<3:4>'. Each of the sixteen cell transistors 'CTR<1:16>' includes a gate connected to a corresponding word line 'WL', a source connected to a corresponding source line 'SL', and a drain connected to a corresponding bit line 'BL'. The cell transistors 'CTR<1:16>' include transistor pairs, wherein a transistor pair is composed of two transistors that share the corresponding source line 'SL'.

As described above, since the cell transistors according to one embodiment are fabricated by implementing the FBC technology, each memory cell needs not to have a switching transistor and a cell capacitor and each transistor can operate as the memory cell. Herein, voltages applied to a gate, a source, and a drain of each transistor should have voltage levels set depending on the operation modes, such that each transistor can perform the read, write, and hold operations. Therefore, each cell transistor can implement each operation mode depending on a voltage supplied through the word line 'WL', a voltage supplied through the source line 'SL', and the a voltage supplied through the bit line 'BL'.

In the refresh mode, the four word lines 'WL<1:4>', the two source lines 'SL<1:2>', and the four bit lines 'BL<1:4>' are activated depending on sequences thereof, such that the refresh operation for each of the cell transistors 'CTR<1:16>' becomes possible. For example, in a state when the first word line 'WL<1>' of the four word lines 'WL<1:4>' and the first source line 'SL<1>' of the two source lines 'SL<1:2>' are activated, the four bit lines 'BL<1:2>' are sequentially activated, such that refresh operations for four cell transistors 'CTR<1, 5, 9, 13>' are sequentially performed. Thereafter, the first word line 'WL<1>' is deactivated and the second word line 'WL<2>' is activated and the above-mentioned operation is again performed, such that refresh operations for another four cell transistors 'CTR<2, 6, 10, 14>' are sequentially performed Thereafter, both the second word line 'WL<2>' and the first source line 'SL<1>' are deactivated and the third word line 'WL<3>' and the second source line 'SL<2>' are activated. In this state, the four bit lines 'BL<1:4>' are sequentially activated, such that refresh operations for the other four cell transistors 'CTR<3, 7, 11, 15>' are sequentially performed. The semiconductor memory apparatus can perform all the refresh operations for the sixteen cell transistors 'CTR<1:16>' by performing the above-mentioned operations.

Figure 5:
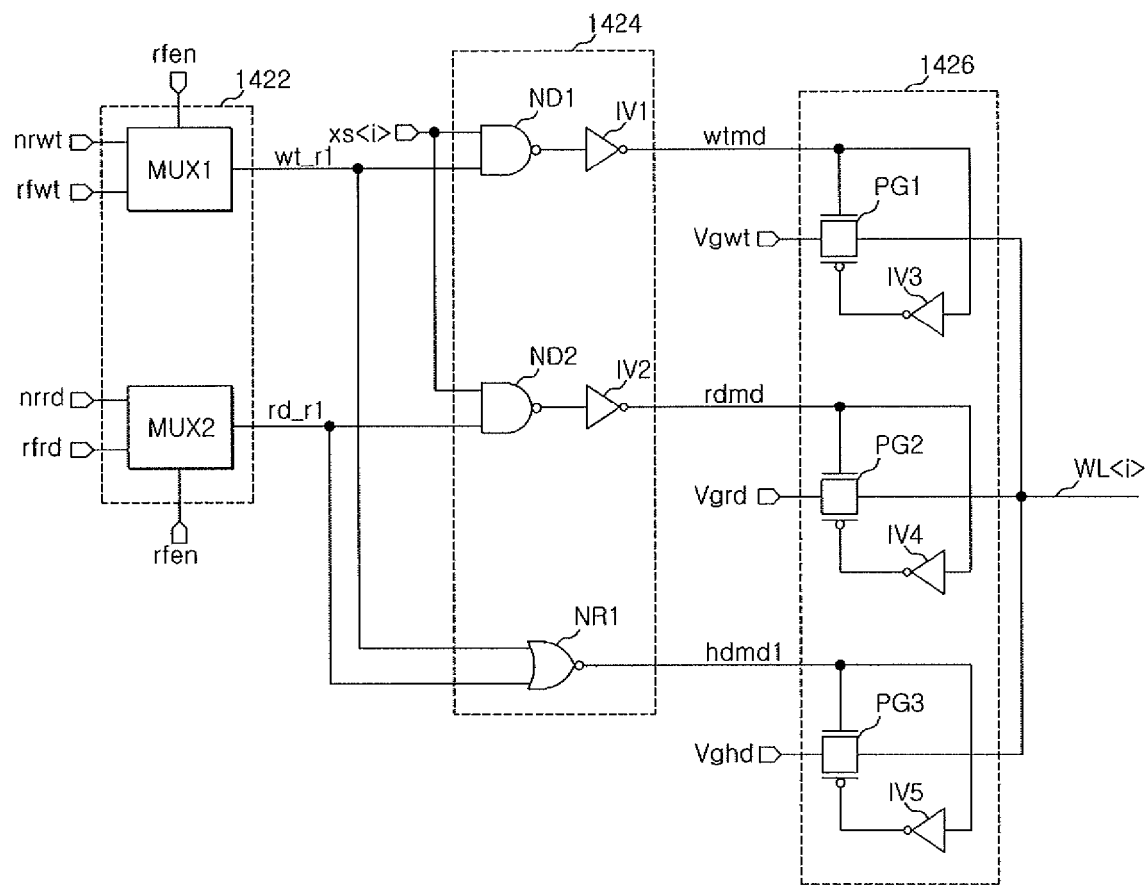
FIG. 5 is a configuration diagram of an exemplary word line driver of FIG. 2 according to one embodiment.

FIG. 5 is a configuration diagram of an exemplary word line driver of FIG. 2 according to one embodiment and illustrates only a configuration in which a voltage is supplied to any one 'WL<i>' of a plurality of word lines for convenience of description. It will be able to be easily analogized by those skilled in the art that the components shown in FIG. 5 are provided as many as the word lines 'WL'.

As shown in FIG. 5, the word line driver 142 can include a first operation mode determining unit 1422, a first operation mode setting unit 1424, and a first switching unit 1426.

The first operation mode determining unit 1422 can selectively output the normal row write signal 'nrwt' or the refresh write signal 'rfwt' as a first row write signal 'wt_r1' and selectively output the normal row read signal 'nrrd' or the refresh read signal 'rfrd' as a first row read signal 'rd_r1', in response to the refresh enable signal 'rfen'. The first operation mode determining unit 1422 can include a first multiplexer MUX1 and a second multiplexer MUX2.

The first operation mode setting unit 1424 can generate a write mode signal 'wtmd', a read mode signal 'rdmd', and a first hold mode signal 'hdmd1' in response to a corresponding row selection signal 'xs<i>' of the plurality of row selection signals 'xs' the first row write signal 'wt_r1', and the first row read signal 'rd_r1'. The first operation mode setting unit 1424 can include a first NAND gate ND1, a second NAND gate ND2, a first inverter IV1, a second inverter IV2, and a first NOR gate NR1.

The first NAND gate ND1 can receive the row selection signal 'xs<i>' and the first row write signal 'wt_r1'. The first inverter IV1 can receive an output signal of the first NAND gate ND1 and output the write mode signal 'wtmd'. The second NAND gate ND2 can receive the row selection signal 'xs<i>' and the first row read signal 'rd_r1'. The second inverter IV2 can receive an output signal of the second NAND gate ND2 and output the read mode signal 'rdmd'. The first NOR gate NR1 can receive the first row write signal 'wt_r1' and the first row read signal 'rd_r1' and output the first hold mode signal 'hdmd1'.

The first switching unit 1426 can supply any one of the write gate voltage 'Vgwt', the read gate voltage 'Vgrd', and the hold gate voltage 'Vghd' to the corresponding word line 'WL<i>' in response to the write mode signal 'wtmd' the read mode signal 'rdmd', and the first hold mode signal 'hdmd1'. The first switching unit 1426 can include a third inverter IV3, a fourth inverter IV4, a fifth inverter IV5, a first path gate PG1, a second path gate PG2, and a third path gate PG3.

The third inverter IV3 can receive the write mode signal 'wtmd'. The first path gate PG1 can transfer the write gate voltage 'Vgwt' to the word line 'WL<i>' in response to the write mode signal 'wtmd' and an output signal of the third inverter IV3. The fourth inverter IV4 can receive the read mode signal 'rdmd'. The second path gate PG2 can transfer the read gate voltage 'Vgrd' to the word line 'WL<i>' in response to the read mode signal 'rdmd' and an output signal of the fourth inverter IV4. The fifth inverter IV5 can receive the first hold mode signal 'hdmd1'. The third path gate PG3 can transfer the hold gate voltage 'Vghd' to the word line 'WL<i>' in response to the first hold mode signal 'hdmd1' and an output signal of the fifth inverter IV5.

Herein, levels of the write gate voltage 'Vgwt', the read gate voltage 'Vgrd', and the hold gate voltage 'Vghd' may be varied depending on characteristics of the cell transistor, but are preferably 0.5V, −1.0V, and −1.5V, respectively.

The first operation mode determining unit 1422 can output the normal row read signal 'nrrd' and the normal row write signal 'nrwt' as the first row read signal 'rd_r1' and the first row write signal 'wt_r1', respectively, when the refresh enable signal 'rfen' is disabled. On the contrary, the first operation mode determining unit 1422 can output the refresh read signal 'rfrd' and the refresh write signal 'rfwt' as the first row read signal 'rd_r1' and the first row write signal 'wt_r1' respectively, when the refresh enable signal 'rfen' is enabled.

The first operation mode setting unit 1424 can enable the write mode signal 'wtmd' when the row selection signal 'xs<i>' is enabled in a state where the first row write signal 'wt_r1' is enabled. The first switching unit 1426 can supply the write gate voltage 'Vgwt' to the word line 'WL<i>' in response to the case that the write mode signal 'wtmd' is enabled.

On the contrary, the first operation mode setting unit 1424 can enable the read mode signal 'rdmd' when the row selection signal 'xs<i>' is enabled in a state where the first row read signal 'rd_r1' is enabled. The first switching unit 1426 can supply the read gate voltage 'Vgrd' to the word line 'WL<i>' in response to the case that the read mode signal 'rdmd' is enabled.

Meanwhile, when both the first row write signal 'wt_r1' and the first row read signal 'rd_r1' are not enabled, the first operation mode setting unit 1424 can enable the first hold mode signal 'hdmd1'. The first switching unit 1426 can supply the hold gate voltage 'Vghd' to the word line 'WL<i>' in response to the case that the first hold mode signal 'hdmd1' is enabled.

Therefore, the refresh read signal 'rfrd' and the refresh write signal 'rfwt' are sequentially enabled in the refresh mode and the signals serve as the first row read signal 'rd_r1' and the first row write signal 'wt_r1', respectively, such that the read gate voltage 'Vgrd' and the write gate voltage 'Vgwt' are sequentially applied to the word line 'WL<i>'. The hold gate voltage 'Vghd' is applied to the word line 'WL<i>' during an interval where the refresh read signal 'rfrd' and the refresh write signal 'rfwt' are both disabled.

Figure 6:
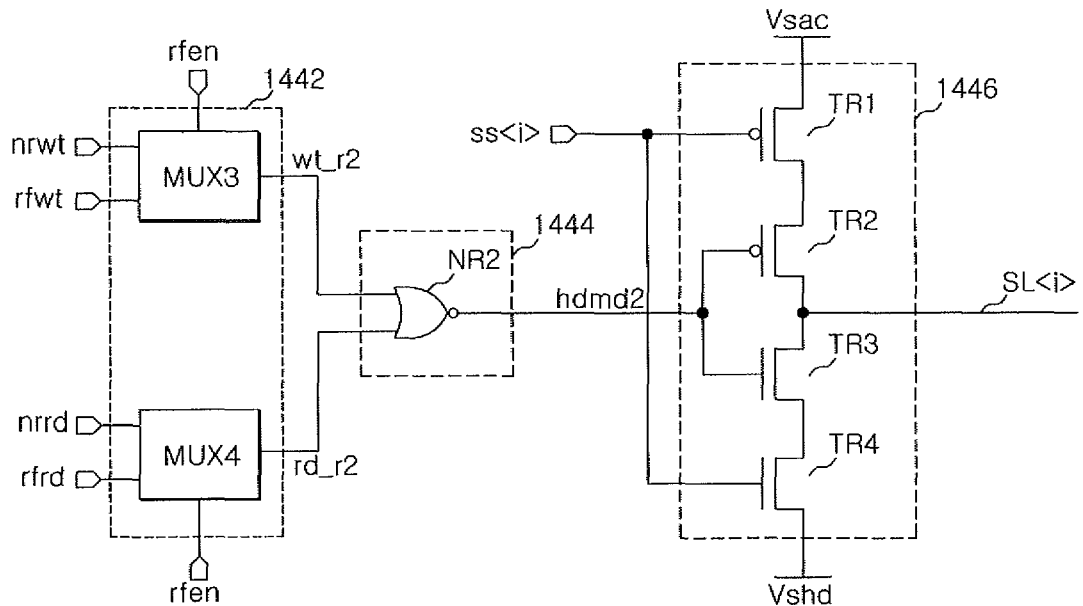
FIG. 6 is a configuration diagram of an exemplary source line driver of FIG. 2 according to one embodiment.

FIG. 6 is a configuration diagram of an exemplary source line driver of FIG. 2 according to one embodiment and illustrates only a configuration in which a voltage is supplied to any one 'SL<i>' of a plurality of source lines for convenience of description. It will be able to be easily analogized by those skilled in the art that the components shown in FIG. 6 are provided as many as the source lines 'SL'.

As shown in FIG. 6, the source line driver 144 can include a second operation mode determining unit 1442, a second operation mode setting unit 1444, and a second switching unit 1446.

The second operation mode determining unit 1442 can selectively output the normal row write signal 'nrwt' or the refresh write signal 'rfwt' as a second row write signal 'wt_r2' and selectively output the normal row read signal 'nrrd' or the refresh read signal 'rfrd' as a second row read signal 'rd_r2', in response to the refresh enable signal 'rfen'. The second operation mode determining unit 1442 can include a third multiplexer MUX3 and a fourth multiplexer MUX4.

The second operation mode setting unit 1444 can generate a second hold mode signal 'hdmd2' in response to the second row write signal 'wt_r2' and the second row read signal 'rd_r2'. The second operation mode setting unit 1444 can include a second NOR gate NR2 that can receive the second row write signal 'wt_r2' and the second row read signal 'rd_r2' and output the second hold mode signal 'hdmd2'.

The second switching unit 1446 can supply the active source voltage 'Vsac' or the hold source voltage 'Vshd' to the corresponding source line 'SL<i>' in response to a corresponding source selection signal 'ss<i>' of the plural-bit source selection signals 'ss' and the second hold mode signal 'hdmd2'. The second switching unit 1446 can include a first transistor TR1, a second transistor TR2, a third transistor TR3, and a fourth transistor TR4.

The first transistor TR1 includes a gate that receives the source selection signal 'ss<i>' and a source that is applied with the active source voltage 'Vsac'. The second transistor TR2 includes a gate that receives the second hold mode signal 'hdmd2', a source that is connected to a drain terminal of the first transistor TR1, and a drain that is connected to the source line 'SL<i>'. The third transistor TR3 includes a gate that receives the second hold mode signal 'hdmd2' and a source that is connected to the source line 'SL<i>'. The fourth transistor TR4 includes a gate that receives the source selection signal 'ss<i>', a drain that is connected to the source terminal of the third transistor TR3, and a source that is applied with the hold source voltage 'Vshd'.

Herein, levels of the active source voltage 'Vsac' and the hold source voltage 'Vshd' may be varied depending on the characteristics of the cell transistor, but are preferably 2.5V and 0V, respectively.

According to the above-mentioned configuration, it can be appreciated that the second hold mode signal 'hdmd2' is enabled when the second row write signal 'wt_r2' and the second row read signal 'rd_r2' are both disabled.

Therefore, when the source selection signal 'ss<i>' is enabled and the active operation mode, that is, the write operation mode or the read operation mode are performed, the active source voltage 'Vsac' is supplied to the source line 'SL<i>'. On the contrary, when a source line activation signal 'slact' is enabled and the hold operation mode is performed, the hold source voltage 'Vshd' is applied to the source line 'SL<i>'.

The refresh read signal 'rfrd' and the refresh write signal 'rfwt' are sequentially enabled in the refresh mode and the signals serve as the second row read signal 'rd_r2' and the second row write signal 'wt_r2', respectively, such that the active source voltage 'Vsac' is applied twice to the source line 'SL<i>'. On the contrary, the hold source voltage 'Vshd' is applied during an interval where the refresh read signal 'rfrd' and the refresh write signal 'rfwt' are both disabled.

Figure 7:
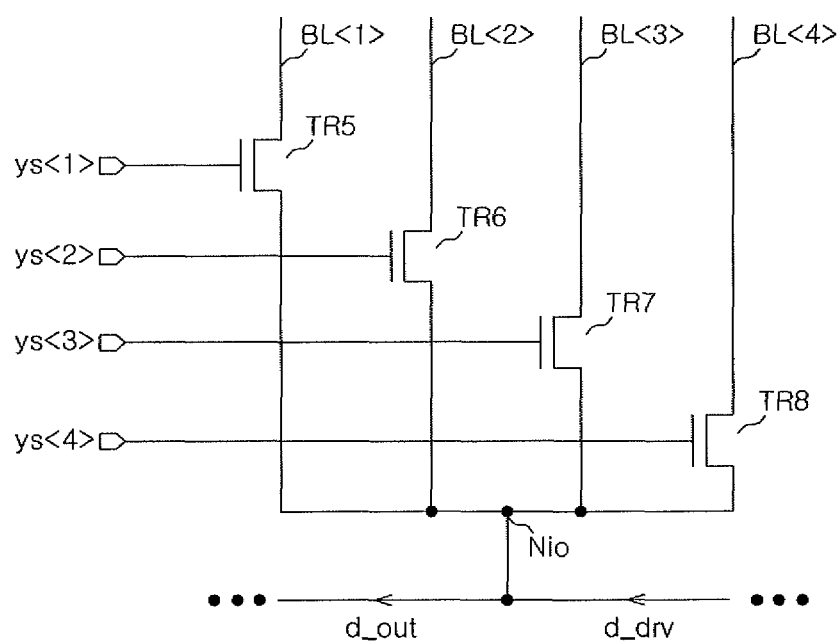
FIG. 7 is a configuration diagram of an exemplary bit line multiplexer of FIG. 2 according to one embodiment.

FIG. 7 is a configuration diagram of an exemplary bit line multiplexer of FIG. 2 according to one embodiment and illustrates only a configuration in which the bit line multiplexer is connected to four bit lines 'BL<1:4>' of a plurality of bit lines for convenience of description. Therefore, four column selection signals 'ys<1:4 >' are also input into the configuration.

As shown in FIG. 7, the bit line multiplexer 176 can include an input/output node Nio, a fifth transistor TR5, a sixth transistor TR6, a seventh transistor TR7, and an eighth transistor TR8.

The input/output node Nio is transferred with the driving data 'd_drv' from the bit line driver 174 and transmits the output data 'd_out' to the sense amplifier 172. The fifth transistor TR5 includes a gate that receives a first column selection signal 'ys<1>' and is disposed between a first bit line 'BL<1>' and the input/output node Nio. The sixth transistor TR6 includes a gate that receives a second column selection signal 'ys<2>' and is disposed between a second bit line 'BL<2>' and the input/output node Nio. The seventh transistor TR7 includes a gate that receives a third column selection signal 'ys<3>' and is disposed between a third bit line 'BL<3>' and the input/output node Nio. The eighth transistor TR8 includes a gate that receives a fourth column selection signal 'ys<4>' and is disposed between a fourth bit line 'BL<4>' and the input/output node Nio.

According to the above-mentioned configuration, the bit line multiplexer 176 connects the input/output node Nio with any one of the plurality of bit lines 'BL' according to control of the plural-bit column selection signal 'ys' output from the column address decoder 16 without dividing the read operation mode, the write operation mode, and the hold operation mode. Since the sense amplifier 172 is deactivated and the bit line driver 174 is activated in the write operation mode, the driving data 'd_drv' can be transferred to the memory cell through any one bit line 'BL'. On the contrary, since the bit line driver 174 is deactivated and the sense amplifier 172 is activated in the read operation mode, the output data 'd_out' output from any one memory cell through a predetermined bit line 'BL' can be output through the sense amplifier 172.

Figure 8:
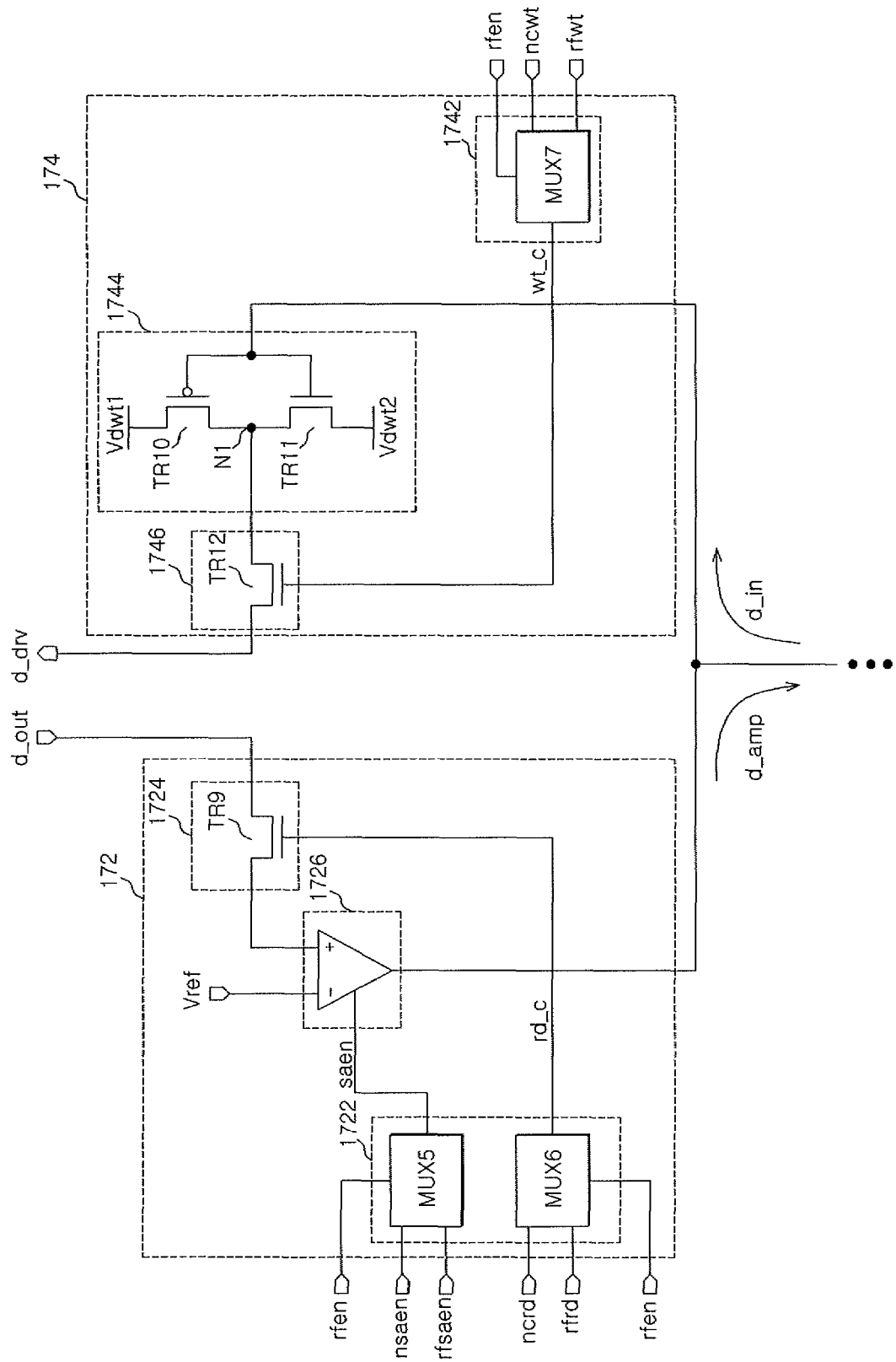
FIG. 8 is a configuration diagram of exemplary sense amplifier and bit line driver of FIG. 2 according to one embodiment.

FIG. 8 is a configuration diagram of exemplary sense amplifier and bit line driver of FIG. 2 according to one embodiment.

As shown in FIG. 8, the sense amplifier 172 can include a third operation mode determining unit 1722, a third operation mode setting unit 1724, and an amplification unit 1726.

The third operation mode determining unit 1722 can selectively output the normal sense amp enable signal 'nsaen' or the refresh sense amp enable signal 'rfsaen' as a sense amp enable signal 'saen' in response to the refresh enable signal 'rfen' and output the normal column read signal 'ncrd' or the refresh read signal 'rfrd' as a column read signal 'rd_c' in response to the refresh enable signal 'rfen'. The third operation mode determining unit 1722 can include a fifth multiplexer MUX5 and a sixth multiplexer MUX6.

The third operation mode setting unit 1724 can set a read operation mode in response to the column read signal 'rd_c' and pass the output data 'd_out'. The third operation mode setting unit 1724 can include a ninth transistor TR9.

The amplification unit 1726 can output the amplification data 'd_amp' by amplifying the output data 'd_out' transmitted through the third operation mode setting unit 1724 in response to the sense amp enable signal 'saen'. The amplification unit 1726 can be easily implemented by using a general differential amplifier circuit that operates by receiving a refresh voltage 'Vref'.

Meanwhile, the bit line driver 174 can include a fourth operation mode determining unit 1742, a driving unit 1744, and a fourth operation mode setting unit 1746.

The fourth operation mode determining unit 1742 can selectively output the normal column write signal 'ncwt' or the refresh write signal 'rfwt' as a column write signal 'wt_c' in response to the refresh enable signal 'rfen'. The fourth operation mode determining unit 1742 can include a seventh multiplexer MUX7.

The driving unit 1744 can output a first write drain voltage 'Vdwt1' or a second write drain voltage 'Vdwt2' in response to the input data 'd_in'. The driving unit 1744 can include a tenth transistor TR10 and an eleventh transistor TR11.

The tenth transistor TR10 includes a gate that receives the input data 'd_in', a source that is applied with the first write drain voltage 'Vdwt1', and a drain that is connected to a first node N1. The eleventh transistor TR11 includes a gate that receives the input data 'd_in', a drain that is connected to the first node N1, and a source that is applied with the second write drain voltage 'Vdwt2'.

The fourth operation mode setting unit 1746 can set a write operation mode in response to the column write signal 'wt_c' and output the driving data 'd_drv' in response to the voltage transferred from the driving unit 1744. The fourth operation mode setting unit 1746 can include a twelfth transistor TR12 that is controlled by the column write signal 'wt_c', and is connected to the first node N1 at one end thereof and outputs the driving data 'd_drv' through the other end thereof.

Herein, a transmission line of the output data 'd_out' that is transmitted to the sense amplifier 172 and a transmission line of the driving data 'd_drv' that is output from the bit line driver 174 are connected to the bit line multiplexer 176.

Further, a transmission line of the amplification data 'd_amp' that is output from the sense amplifier 172 and a transmission line of the input data 'd_in' that is transmitted to the bit line driver 174 are the same line and are connected to the data bus switch 18.

During the normal operation, the normal sense amp enable signal 'nsaen' and the normal column read signal 'ncrd' serve as the sense amp enable signal 'saen' and the column read signal 'rd_c', respectively, and the normal column write signal 'ncwt' serves as the column write signal 'wt_c'. Therefore, the sense amplifier 172 and the bit line driver 174 operate in response to the normal column read signal 'ncrd' and the normal column write signal 'ncwt', respectively.

However, during the refresh operation, the refresh sense amp enable signal 'rfsaen' and the refresh read signal 'rfrd' serve as the sense amp enable signal 'saen' and the column read signal 'rd_c', respectively, and the refresh write signal 'rfwt' serves as the column write signal 'wt_c'. As described above, in this case, the refresh sense amp enable signal 'rfsaen' and the refresh read signal 'rfrd' are enabled and thereafter, the refresh write signal 'rfwt' is enabled.

Therefore, when the refresh operation is started, the operation of the bit liner driver 174 is started after the sense amplifier 172 outputs the amplification data 'd_amp'. At this time, since the data bus switch 18 is turned off, the amplification data 'd_amp' is input into the bit line driver 174 as the input data 'd_in'. When the refresh write signal 'rfwt' is enabled, the bit line driver 174 applies the first write drain voltage 'Vdwt1' or the second write drain voltage 'Vdwt2' to a data output line depending on the logical value of the input data 'd_in', such that the driving data 'd_drv' is output.

Herein, levels of the first write drain voltage 'Vdwt1' and the second write drain voltage 'Vdwt2' may be varied depending on the characteristics of the cell transistor, but are preferably 0.5V and 0V, respectively.

As described above, a semiconductor memory apparatus can implement a memory cell block by using a transistor implementing an FBC technology. For this, the semiconductor memory apparatus includes a plurality of word lines that are connected to gates, a plurality of source lines that are connected to sources, and a plurality of bit lines that are connected to drains of a plurality of cell transistors of the memory cell block and applies voltages set depending on operations modes. The cell transistors that implement an FBC by the above-mentioned configuration can perform operations depending on the operation modes by dividing a read operation, a write operation and a hold operation. Like this, it is possible to remarkably reduce an occupied area of a memory core region and considerably improve an integration degree of the semiconductor memory apparatus by implementing the memory cell using the FBC technology.

Further, since data may be lost due to characteristics of an FBC transistor, a refresh operation should be implemented. For this, when a refresh signal is enabled, the semiconductor memory apparatus enables a refresh read signal and outputs data from any one memory cell by supplying voltages to a word line, a source line, and a bit line. Thereafter, the semiconductor memory apparatus disables the refresh read signal and enables a refresh write signal, and then rewrites the data in the bit line by supplying a voltage having a level corresponding to a logical value of the data output from the memory cell to the bit line.

The semiconductor memory apparatus sequentially performs refresh operations for a plurality of bit lines in a state when a word line and a source line are activated and performs the above-mentioned operations after activating the other word line again. Thereafter, the semiconductor memory apparatus performs the above-mentioned operations again after activating the other word line and another source line. The semiconductor memory apparatus can perform refresh operations for all memory cells in the memory cell block by repetitively performing the operations. The semiconductor memory apparatus can stably store the data by performing the refresh operation.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A semiconductor memory apparatus, comprising:
a memory cell block comprising a plurality of floating body cell (FBC) transistors, each FBC transistor having a gate connected to a word line, a drain connected to a bit line, and a source connected to a source line,
wherein FBC transistor pairs are formed by sharing the source lines in the FBC transistors,
wherein when a refresh signal is enabled, the semiconductor memory apparatus is configured to read data stored in the memory cell block in response to an enabled refresh read signal and then rewrite the read data in the memory cell block in response to an enabled refresh write signal.

2. The semiconductor memory apparatus of claim 1, further comprising a refresh controller configured to generate a refresh enable signal in response to the refresh signal, configured to sequentially enable the refresh read signal and the refresh write signal, and configured to generate a refresh sense amp enable signal having an enable interval the same as that of the refresh read signal.

3. The semiconductor memory apparatus of claim 2, further comprising:
a row refresh counter configured to generate a row counting signal and a source counting signal by performing a counting operation when the refresh enable signal is enabled;
a row address decoder configured to generate a row selection signal by decoding the row counting signal;
a source address decoder configured to generate a source selection signal by decoding the source counting signal; and
a row operation controller configured to supply voltages to the word line and the source line in response to the row selection signal and the source selection signal when the refresh enable signal is enabled.

4. The semiconductor memory apparatus of claim 3, wherein the row operation controller includes:
a word line driver configured to supply the voltage to the word line in response to the refresh enable signal, to the refresh read signal, to the refresh write signal, and to the row selection signal; and
a source line driver configured to supply the voltage to the source line in response to the refresh enable signal, to the refresh read signal, to the refresh write signal, and to the source selection signal.

5. The semiconductor memory apparatus of claim 4, wherein the word line driver is configured to supply any one of a write gate voltage, a read gate voltage, and a hold gate voltage to the word line as a function of corresponding operation modes, divided into a read operation mode, a write operation mode and a hold operation mode, in response to the refresh read signal and the refresh write signal when the refresh enable signal is enabled.

6. The semiconductor memory apparatus of claim 4, wherein the source line driver is configured to supply an active source voltage or a hold source voltage to the source line depending on corresponding operation modes, divided into a hold operation mode and an active operation mode, in response to the refresh read signal and the refresh write signal during a refresh operation.

7. The semiconductor memory apparatus of claim 2, further comprising:
a column refresh counter configured to generate a column counting signal by performing a counting operation when the refresh enable signal is enabled;
a column address decoder configured to generate a column selection signal by decoding the column counting signal;
a column operation controller configured to sequentially rewrite data of the bit line in response to the column selection signal when the refresh enable signal is enabled; and
a data bus switch configured to interrupt connection of the column operation controller and a data input/output bus when the refresh enable signal is enabled.

8. The semiconductor memory apparatus of claim 7, wherein the column operation controller includes:
a sense amplifier configured to output amplification data by amplifying output data in response to the refresh enable signal, the refresh read signal and the refresh sense amp enable signal;
a bit line driver configured to output driving data by driving the amplification data in response to the refresh enable signal and the refresh write signal; and
a bit line multiplexer configured to transfer the driving data to any one of the plurality of bit lines or transfer data transferred from any one of the plurality of bit lines to the sense amplifier as the output data in response to the plural-bit column selection signal.

9. The semiconductor memory apparatus of claim 8, wherein the bit line driver is configured to distinguish whether or not to enter a write operation mode in response to the refresh write signal during the refresh operation and supply a write drain voltage to an output line of the driving data by determining a logical value of the amplification data during the write operation.

10. A semiconductor memory apparatus, comprising:
a refresh controller configured to generate a refresh enable signal, a refresh read signal, a refresh write signal, and a refresh sense amp enable signal in response to a refresh signal;
a row operation controller configured to supply voltages to a word line and a source line of a memory cell block in response to the refresh read signal and the refresh write signal when the refresh enable signal is enabled;
a column operation controller configured to amplify data transferred from a bit line of the memory cell block in response to the refresh read signal, the refresh sense amp enable signal, and the refresh write signal when the refresh enable signal is enabled and configured to supply a voltage corresponding to the amplified data to the bit line; and
a data bus switch configured to interrupt outputting of the amplified data to a data input/output bus when the refresh enable signal is enabled.

11. The semiconductor memory apparatus of claim 10, wherein the refresh controller is configured to generate the refresh enable signal enabled during a first interval, configured to generate the refresh read signal enabled after the first interval is started and disabled before the first interval is finished, and configured to generate the refresh write signal enabled after the refresh read signal is disabled and disabled before the first interval is finished.

12. The semiconductor memory apparatus of claim 10, wherein the plurality of word lines and the plurality of source lines are provided in the memory cell block, and
wherein the row operation controller is configured to sequentially supply predetermined voltages to the plurality of word lines and the plurality of source lines depending on variations of logical values of a plural-bit row selection signal and a plural-bit source selection signal.

13. The semiconductor memory apparatus of claim 12, wherein the row operation controller comprises:
a word line driver configured to supply voltages to the plurality of word lines in response to the refresh enable signal, the refresh read signal, the refresh write signal, and the plural-bit row selection signal; and
a source line driver configured to supply voltages to the plurality of source lines in response the refresh enable signal, the refresh read signal, the refresh write signal, and the plural-bit source selection signal.

14. The semiconductor memory apparatus of claim 13, wherein the word line driver is configured to supply any one of a write gate voltage, a read gate voltage, and a hold gate voltage to an activated word line depending on corresponding operation modes divided into a read operation mode, a write operation mode, and a hold operation mode in response to the refresh read signal and the refresh write signal in a state when the refresh enable signal is enabled.

15. The semiconductor memory apparatus of claim 14, wherein the word line driver comprises:
an operation mode setting unit configured to generate a write mode signal, a read mode signal, and a hold mode signal in response to a corresponding row selection signal of the plurality of row selection signal, the refresh write signal, and the refresh row signal when the refresh enable signal is enabled; and
a switching unit configured to supply any one of the write gate voltage, the read gate voltage, and the hold gate voltage to the activated word line in response to the write mode signal, the read mode signal, and the hold mode signal.

16. The semiconductor memory apparatus of claim 13, wherein the source line driver is configured to supply an active source voltage or a hold source voltage to an activated source line depending on corresponding operation modes divided into a hold operation mode and an active operation mode in response to the refresh read signal and the refresh write signal during a refresh operation.

17. The semiconductor memory apparatus of claim 16, wherein the source line driver includes:
an operation mode setting unit configured to generate the hold mode signal in response to the refresh write signal and the refresh read signal when the refresh enable signal is enabled; and
a switching unit configured to supply the active source voltage or the hold source voltage to a corresponding source line in response to a corresponding source selection signal of the plural-bit source selection signals and the hold mode signal.

18. The semiconductor memory apparatus of claim 10, wherein the plurality of bit lines are provided in the memory cell block, and wherein the column operation controller is configured to sequentially activate the plurality of bit lines depending on variations of logical values of the plural-bit column selection signals.

19. The semiconductor memory apparatus of claim 18, wherein the column operation controller includes:
a sense amplifier configured to output amplification data by amplifying output data in response to the refresh enable signal, the refresh read signal and the refresh sense amp enable signal;
a bit line driver configured to output driving data by driving the amplification data in response to the refresh enable signal and the refresh write signal; and
a bit line multiplexer configured to transfer the driving data to any one of the plurality of bit lines or transfer data transferred from any one of the plurality of bit lines to the sense amplifier as the output data in response to the plural-bit column selection signal.

20. The semiconductor memory apparatus of claim 19, wherein the sense amplifier includes:
an operation mode setting unit configured to set a read operation mode in response to the refresh read signal and configured to pass the output data when the refresh enable signal is enabled; and
an amplification unit configured to output the amplification data by amplifying the output data transmitted through the operation mode setting unit in response to the refresh sense amp enable signal when the refresh enable signal is enabled.

21. The semiconductor memory apparatus of claim 19, wherein the bit line driver is configured to distinguish whether or not to enter a write operation mode in response to the refresh write signal during the refresh operation and supply a write drain voltage to an output line of the driving data by determining a logical value of input data during the write operation.

22. The semiconductor memory apparatus of claim 21, wherein the bit line driver includes:
a driving unit configured to output a first write drain voltage or a second write drain voltage in response to the input data; and
an operation mode setting unit configured to set a write operation mode in response to the refresh write signal and output the driving data in response to a voltage transferred from the driving unit during the refresh enable signal is enabled.

23. The semiconductor memory apparatus of claim 10, wherein the memory cell block includes a plurality of memory cells that each are constituted by a floating body cell (FBC) transistor having a gate connected to the word line, a source connected to the source line, and a drain connected to the bit line.

24. A semiconductor memory apparatus, comprising:
a row refresh counter configured to generate a row counting signal and a source counting signal by performing a counting operation when a refresh enable signal is enabled;
a row address decoder configured to generate a row selection signal by decoding the row counting signal;
a source address decoder configured to generate a source selection signal by decoding the source counting signal;
a row operation controller configured to sequentially supply voltages to a plurality of word lines and a plurality of source lines of a memory cell block in response to the row selection signal and the source selection signal when the refresh enable signal is enabled;
a column refresh counter configured to generate a column counting signal by performing the counting operation when the refresh enable signal is enabled;
a column address decoder configured to generate a column selection signal by decoding the column counting signal; and
a column operation controller configured to sequentially rewrite data of a plurality of bit lines of the memory cell block in response to the column selection signal when the refresh enable signal is enabled.

25. The semiconductor memory apparatus of claim 24, wherein the row refresh counter is configured to perform the counting operation for the row counting signal twice as fast as a counting operation for the source counting signal, and
wherein the column refresh counter is configured to perform the counting operation for the column counting signal faster, by as many as the plurality of bit lines, than the counting operation for the row counting signal of the row refresh counter.

26. The semiconductor memory apparatus of claim 25, wherein the column operation controller is configured to sequentially perform refresh operations for the plurality of bit lines when any one of the plurality of word lines and any one of the plurality of source lines are activated.

27. The semiconductor memory apparatus of claim 26, wherein the row operation controller is configured to change only the activated word line or change both the activated word line and the activated source line when the column operation unit completes the refresh operation for each of the plurality of bit lines.

28. The semiconductor memory apparatus of claim 24, further comprising:
a refresh controller configured to generate the refresh enable signal having a predetermined enable interval in response to a refresh signal and generate a refresh read signal and a refresh write signal that are sequentially enabled when the refresh enable signal is enabled.

29. The semiconductor memory apparatus of claim 28, wherein the row operation controller includes:
a word line driver configured to supply voltages to the plurality of word lines in response to the refresh enable signal, the refresh read signal, the refresh write signal, and the row selection signal; and
a source line driver configured to supply voltages to the plurality of source lines in response to the refresh enable signal, the refresh read signal, the refresh write signal, and the source selection signal.

30. The semiconductor memory apparatus of claim 29, wherein the word line driver is configured to supply any one of a write gate voltage, a read gate voltage, and a hold gate voltage to an activated word line of the plurality of word lines depending on operation modes by dividing a read operation mode, a write operation mode, and a hold operation mode in response to the refresh read signal and in response to the refresh write signal when the refresh enable signal is enabled.

31. The semiconductor memory apparatus of claim 28, wherein the source line driver is configured to supply an active source voltage or a hold source voltage to an activated source line of the plurality of source lines depending on corresponding operation modes, divided into a hold operation mode and an active operation mode, in response to the refresh read signal and the refresh write signal during a refresh operation.

32. The semiconductor memory apparatus of claim 28, wherein the refresh controller further generates a refresh sense amp enable signal having the same waveform as the refresh read signal, and wherein the column operation controller comprises:
- a sense amplifier configured to output amplification data by amplifying output data in response to the refresh enable signal, the refresh read signal and the refresh sense amp enable signal;
- a bit line driver configured to output driving data by driving the amplification data in response to the refresh enable signal and the refresh write signal; and
- a bit line multiplexer configured to transfer the driving data to any one of the plurality of bit lines or transfer data transferred from any one of the plurality of bit lines to the sense amplifier as the output data in response to the plural-bit column selection signal.

33. The semiconductor memory apparatus of claim 32, wherein the bit line driver is configured to distinguish whether or not to enter a write operation mode in response to the refresh write signal during the refresh operation and is configured to supply a write drain voltage to an output line of the driving data by determining a logical value of input data during the write operation.

34. The semiconductor memory apparatus of claim 32, further comprising a data bus switch configured to interrupt outputting of the amplification data to a data input/output bus when the refresh enable signal is enabled.

35. The semiconductor memory apparatus of claim 24, wherein the memory cell block includes a plurality of memory cells such that each memory cell comprises a floating body cell (FBC) transistor having a gate connected to the word line, a source connected to the source line, and a drain connected to the bit line.

36. A refresh control method of a semiconductor memory apparatus including a memory cell block having a plurality of floating body cell (FBC) transistors having a gate connected to a word line, a drain connected to a bit line, and a source connected to a source line, wherein FBC transistor pairs are formed by sharing the source lines in the FBC transistors, the refresh control method comprising:
- enabling a refresh read signal when a refresh signal is enabled;
- outputting data from any one memory cell by supplying voltages to the word line, the source line, and the bit line in response to the refresh read signal;
- disabling the refresh read signal and enabling a refresh write signal; and
- rewriting the data in the bit line by supplying a voltage having a level corresponding to a logical value of data outputted from the memory cell to the bit line in response to the refresh write signal.

37. The refresh control method of claim 36, wherein the outputting the data comprises: selecting the word line, the source line, and the bit line in response to a row selection signal, a source selection signal, and a column selection signal; supplying a read gate voltage to the word line and supplying an active source voltage to the source line; and amplifying data output through the bit line from the memory cell.

38. The refresh control method of claim 37, wherein the outputting the data amplifies and outputs the data output from the memory cell and interrupts transmission of the amplification data to a data input/output bus.

39. The refresh control method of claim 36, wherein the rewriting the data, interrupts inputting of the data from the data input/output bus and drives the bit line using a first write drain voltage, or a second write drain voltage by determining a logical value of the data outputted from the memory cell.

40. A refresh control method of a semiconductor memory apparatus including a memory cell block composed of a plurality of floating body cell (FBC) transistors, each FBC transistor having a gate connected to a word line, a drain connected to a bit line, and a source connected to a source line, wherein FBC transistor pairs are formed by sharing the source lines in the plurality of the floating body cell transistors, the refresh control method comprising:
- supplying voltages for a read operation or a write operation to a first word line and a first source line when a refresh enable signal is enabled;
- sequentially performing a rewriting operation of data for the plurality of bit lines;
- deactivating the first word line and supplying a voltage for the read or write operation to a second word line;
- sequentially re-performing the rewriting operation of the data in the plurality of bit lines; and
- deactivating the second word line and the first source line and activating a third word line and a second source line.

41. The refresh control method of claim 40, wherein the supplying the voltage for the read or write operation to the first word line and the first source line comprises:
- supplying a read gate voltage to the first word line and supplying an active source voltage to the first source line;
- supplying a hold gate voltage to the first word line and supplying a hold source voltage to the first source line; and
- supplying a write gate voltage to the first word line and supplying the active source voltage to the first source line.

42. The refresh control method of claim 40, wherein the performing the rewriting operation of the data for the plurality of bit lines includes:
- outputting and amplifying data from any one of the plurality of bit lines; interrupting inputting of data from a data input/output bus and determining a logical value of the amplified data; and
- supplying a first write drain voltage or a second write drain voltage to any one bit line as a function of the logical value of the amplified data.

43. The refresh control method of claim 40, wherein the supplying the voltage for the read or write operation to the second word line includes:
- supplying the read gate voltage to the second word line and the active source voltage to the first source line;
- supplying the hold gate voltage to the second word line and supplying the hold source voltage to the first source line; and
- supplying the write gate voltage to the second word line and supplying the active source voltage to the first source line.

44. The refresh control method of claim 40, wherein the activating the third word line and the second source line comprises:
- supplying the read gate voltage to the third word line and supplying the active source voltage to the second source line;
- supplying the hold gate voltage to the third word line and the supplying the hold source voltage to the second source line; and
- supplying the write gate voltage to the third word line and the supplying the active source voltage to the second source line.

* * * * *